US008008931B2

(12) United States Patent
Parvinen et al.

(10) Patent No.: US 8,008,931 B2
(45) Date of Patent: Aug. 30, 2011

(54) METHOD AND DEVICE FOR MONITORING THE OPERATION OF A FLOTATION CELL

(75) Inventors: Pekka Parvinen, Outokumpu (FI); Jouko Kallioinen, Outokumpu (FR); Veikko Eronen, Outokumpu (FI)

(73) Assignee: Geologian Tutkimuskeskus GTK, Espoo (FI)

( * ) Notice: Subject to any disclaimer, the term of this patent is extended or adjusted under 35 U.S.C. 154(b) by 643 days.

(21) Appl. No.: 12/091,300

(22) PCT Filed: Oct. 24, 2006

(86) PCT No.: PCT/FI2006/000341
§ 371 (c)(1),
(2), (4) Date: Sep. 25, 2008

(87) PCT Pub. No.: WO2007/048869
PCT Pub. Date: May 3, 2007

(65) Prior Publication Data

US 2009/0217741 A1 Sep. 3, 2009

(30) Foreign Application Priority Data

Oct. 24, 2005 (FI) ..................................... 20051073

(51) Int. Cl.
*G01R 31/26* (2006.01)

(52) U.S. Cl. ...................................................... 324/693

(58) Field of Classification Search ......................... None
See application file for complete search history.

(56) References Cited

U.S. PATENT DOCUMENTS

| | | | | |
|---|---|---|---|---|
| 4,059,016 | A * | 11/1977 | Kitzinger et al. | 73/304 R |
| 6,778,881 | B1 * | 8/2004 | Du Plessis et al. | 700/265 |
| 2006/0213255 | A1 | 9/2006 | Zhu et al. | |

FOREIGN PATENT DOCUMENTS

| | | |
|---|---|---|
| DE | 4429277 | 2/1996 |
| DE | 4429277 A1 * | 2/1996 |
| RU | 2006290 | 1/1994 |
| SU | 484011 | 9/1975 |
| SU | 1614852 | 12/1990 |
| WO | WO 9745203 | 12/1997 |
| WO | WO 0068672 | 11/2000 |

OTHER PUBLICATIONS

Zhu J. Y. et al., "Monitoring Liquid and Solid Contend in Froth Using Conductivity", Progress in Paper Recycling, vol. 14, No. 4, Aug. 2005, pp. 21-29.
International Search Report of PCT/FI2006/000341.

* cited by examiner

*Primary Examiner* — Hezron Williams
*Assistant Examiner* — Nathaniel Kolb
(74) *Attorney, Agent, or Firm* — Young & Thompson

(57) ABSTRACT

The invention relates to a method of and a device for monitoring the operation of a flotation cell. In the method according to the invention, the electrical conductivity of the material (3, 7) in the flotation cell (1) is measured to observe any variations in the movement, the properties and/or the inner structure of the material. The device (10) according to the invention comprises a number of measuring sensors (11, 12, 13, 14) of electrical conductivity, which are to be fitted in the flotation cell (1) and embedded in the material (3, 7) contained in it for measuring its electrical conductivity and, on the basis of the conductivity values, defining the state and/or the properties of the material.

10 Claims, 2 Drawing Sheets

METHOD AND DEVICE FOR MONITORING THE OPERATION OF A FLOTATION CELL

The invention relates to a method according to the preamble of Claim 1 for monitoring the operation of a flotation cell.

The invention also relates to a device according to the preamble of Claim 7 for monitoring the operation of the flotation cell.

Flotation machines or plants are used for separating the valuable ingredients, such as concentrates contained in slurry, specifically ore pulp, from the rest of the material. The flotation machine comprises a flotation cell 1 (cf. FIG. 1), wherein the slurry 3 to be treated is arranged. Slurry 3 is supplied to the flotation cell through its side wall by means of suitable feeding devices 2, for example. Air is fed into the slurry 3 and it is mixed by mixing and air supply devices 4. The slurry 3 thus turns into a mixture of air bubbles 5 and particles of solid slurry material. Reagents are also added to the slurry in the flotation cell by means of a suitable feeding device 6. The reagents attach to the surfaces of the particles of the valuable ingredients, i.e., the valuable particles that are in the slurry. The reagents render the valuable particles hydrophobic and, thus, advance the attachment of the valuable particles to the air bubbles 5. The valuable particles rise upwards (arrows 51) along with the air bubbles 5 in the slurry of the flotation cell, forming a froth bed 7 on top of the slurry in the upper part of the flotation cell, the froth being removed or allowed to flow out over the overflow edge 1*a* of the cell as a mixture of minerals, i.e., a concentrate 8. The excess slurry is removed from cell 9.

Several flotation cells can be connected sequentially and/or in parallel. Their slurry volumes may vary from a few cubic meters to as much as hundreds of cubic meters. Regarding the structures of the flotation cells, reference is made to the international patent applications WO-01/43881 and WO-2006/095044, for example.

Efforts are made to monitor and control the operation of the flotation cell so as to obtain an optimal separation result, i.e., to separate an as large as possible amount of concentrate from the slurry. The variables affecting the separation results include, among others, the stability of the process and, specifically, the froth layer, the froth or concentrate speed, the air content, the size of the air bubbles, and the dosage of reagent(s). The concentrate is recovered over the overflow edge of the flotation cell, and the froth speed at the spot in question is directly proportional to the concentration grade obtained. Today, one of the most important tasks of the monitor of the flotation cell is to ensure that the concentrate moves over the overflow edge at a desired and controlled velocity. However, it should be kept in mind that the operator cannot monitor one flotation cell throughout his or her shift, but that there are always other tasks and problems to solve.

From the international published patent application WO-01/38001, a monitoring and control arrangement of the flotation cell of a flotation plant is previously known, the arrangement using a camera to define the characteristics of the froth bed. A corresponding method and device for monitoring and analyzing the surface of the froth bed is disclosed in Finnish patent application 20041089.

The above-mentioned international publication (p. 7) discloses the basic rules for the optimal control of the flotation cell. The froth speed is controlled in accordance with the following basic instructions. If the speed is higher than the desired standard value of the speed, then, to lower the speed, any of the following measures should be carried out: reducing the air content that is fed into the slurry, lowering the surface of the slurry in the flotation cell, or reducing the dosages of reagents, specifically agents that promote froth formation i.e., frothers. In case the speed is lower than the desired standard value of the speed, then, to increase the speed, any of the following measures should be carried out: increasing the air content fed into the slurry, raising the surface of the slurry in the flotation cell, or increasing the dosages of reagents, the agents promoting froth formation, in particular. The concentration grade, in turn, is controlled by changing the standard value of the froth speed: if the concentration grade is low, the standard value of the flow speed is decreased and, correspondingly, if the concentration grade is too high, the standard value of the flow speed is increased.

Efforts have also been made to follow these instructions in the control arrangement disclosed in the international patent specification, wherein the froth speed, the air bubble size and the stability of the froth, among others, have been measured at a very large sampling frequency.

One problem with these types of monitoring and control arrangements is that, by means of the camera, the froth bed on the surface of the flotation cell can be observed from the outside only. Thus, no information is obtained about the state of the slurry or the properties of the froth inside the froth bed. In problem situations, then, any controlling measures directed to the flotation cell are delayed, as the flotation process, for example, has already been interrupted at the time of observing a substantial lowering of the surface of the froth layer.

The object of the invention is to eliminate the disadvantages related to the monitoring of the flotation cell presented above. Another object of the invention is to provide a new method and device that are suited to monitoring the flotation cell during operation and, in particular, measuring the state and/or the properties of its slurry and/or froth bed. It is preferable to utilize the obtained monitoring and/or measuring information for the optimal control of the flotation cell.

The method according to the invention relates to monitoring the operation of the flotation cell. According to the invention, the method is used for measuring the electrical conductivity or a corresponding variable of the material in the flotation cell so as to observe any variations in the movement, the properties and/or the inner structure of the material. The material in the flotation cell comprises slurry and/or froth, which forms a froth bed on top of the slurry. It is obvious that instead of the electrical conductivity (or the current-carrying capacity), a variable reverse to it, i.e., the electric resistance, can be measured. The electrical conductivity reflects the properties of both the froth bed and the slurry, and on the basis of this, distinct and unambiguous conclusions can be made, concerning the state of the material in the flotation cell. Specifically the following facts that depict the state and/or the properties of the material can be defined by measuring the electrical conductivity or the corresponding variable: the movement and/or the speed of movement of the froth in the flotation cell, the air content of the slurry and/or the properties of the air bubbles contained in it, the electrical conductivity of the slurry, as well as any variations in the structure, such as the density, of the material, i.e., both the slurry and the froth.

The electrical conductivity measurements can be implemented by means of suitable electrical measuring sensors, which are embedded in the material of the flotation cell, and actual indicator devices that are connected therewith to bring out the measuring signals from the sensors.

One significant advantage of the invention is the fact that measurement data is obtained from within the material of the flotation cell. The measuring results provide a reliable picture of the state and the properties of the flotation cell material, and one no longer needs to rely on the optical observation of the surface layer of the froth bed alone. Another advantage is that the measurement data is obtained immediately in real time.

In the most preferred embodiment of the method according to the invention, the electrical conductivity of the material in the flotation cell is measured in a vertical direction at different depths on several measurement planes. There is the advantage that a distinct idea is obtained on what happens in the material in the flotation cell at different depths during the enrichment process, as viewed from the surface of the froth bed.

In a second preferred embodiment of the method according to the invention, the electrical conductivity of the froth bed in the flotation cell is measured in the vertical direction on a first measurement plane, the conductivity measurements being used in following the froth speed towards the overflow edge of the flotation cell, in particular. One advantage is the simple and reliable method of measurement, by which one can reliably monitor one variable that is important for the optimal operation of the flotation cell. On the first measurement plane, there can be several measurement points, especially, if the flotation cell is large. On the basis of the obtained conductivity measuring values, the momentary speed of the concentrate, at which it exits the flotation cell, can be calculated and monitor any changes in this speed.

In a third preferred embodiment of the method according to the invention, the electrical conductivity of the froth bed in the flotation cell is measured in the vertical direction on a second measurement plane, the conductivity measurements being used in monitoring any changes in the froth bed, specifically any variations in the froth properties, which predict a froth collapse or overfrothing. It has been observed that the electrical conductivity of the froth changes, i.e., increases or decreases quickly just before the froth collapse or overfrothing. In that case, it is thus preferable to monitor the rate of change in the electrical conductivity, which can be directly used for predicting any instability in the froth bed. It is preferable that the second measurement plane be in the lower part of the froth bed near the interface between the slurry and the froth.

In a fourth preferred embodiment of the method according to the invention, the conductivity of the slurry in the flotation cell is measured in the vertical direction on at least one third measurement plane, the conductivity measurements being used in monitoring any changes in the air content of the slurry and/or the air bubble sizes of the slurry. The air content of the slurry and, at the same time, the number and size of the air bubbles influence the electrical conductivity of the slurry, and this can be observed in the slurry that moves between the measuring heads of the measuring sensor. On the basis of the obtained conductivity measuring values, the air content of the slurry can be calculated and also assess the size of the air bubbles contained in the slurry, and monitor any variations in the air content and the air bubbles, as well as control the supply of flotation reagents into the flotation cell.

In a fifth preferred embodiment of the method according to the invention, the first conductivity value of the slurry in the flotation cell is defined together with the air bubbles that are contained in it, and the second conductivity value is defined for the slurry alone, the definitions of the conductivities being preferably carried out on the same third measurement plane. Thus, the second conductivity value is defined for the slurry essentially without the air bubbles. In that case, the entrance of the air bubbles to the measuring point, i.e., to the vicinity of the measuring heads of the measuring sensor in question is prevented. There is the advantage that the said two pieces of conductivity measurement information can be compared with one another and, as a result, in addition to the relative air content of the slurry, also the absolute air content can be obtained. The ion concentration or strength of the slurry, which is depicted by the second measuring value, and its variations, can be defined as a reference value for the other measuring values of the electrical conductivity obtained by means of the method.

The device according to the invention relates to monitoring the operation of the flotation cell. The device according to the invention comprises a number of measuring sensors for measuring the electrical conductivity or a corresponding variable, the sensors being fitted in the flotation cell and embedded in the material contained in it to measure its electrical conductivity or corresponding variable and, on the basis of the electrical conductivity values, to define the state and/or the properties of the material.

Advantages of the device according to the invention include its simple structure, reliable operation and the customization of the device for various enrichment processes implemented by means of the flotation cell. A further advantage is that the device is easy to integrate as part of a control system.

In the most preferred embodiment according to the invention, the measuring sensors are arranged on an elongated support at a small distance from one another, so that the support and the measuring sensors can be fitted in the flotation cell and the material contained in it essentially in the vertical direction to measure the electrical conductivity of the material in the vertical direction on several measurement planes. There is the advantage that the device is easy to fit and install in connection with various flotation cells. Another advantage is that the measurement planes of the measuring sensors can be linearly defined and installed in the device.

In the following, the invention and the other advantages thereof are described in detail with reference to the appended drawing, in which.

In the figures, the same reference numbers are used for the corresponding parts.

Figure 1:
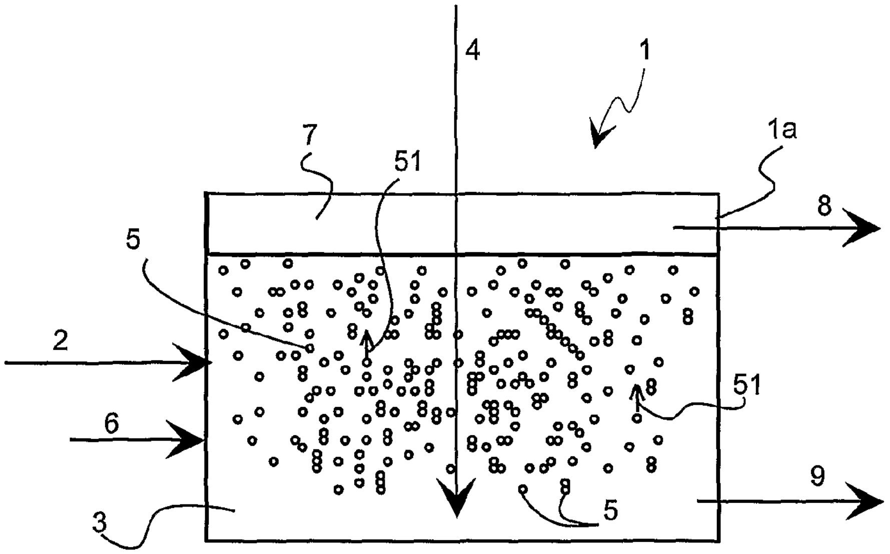
FIG. 1 shows schematically the flotation cell.

In the preamble of the specification above, the basic structure of the flotation cell was presented with reference to FIG. 1.

Figure 2:
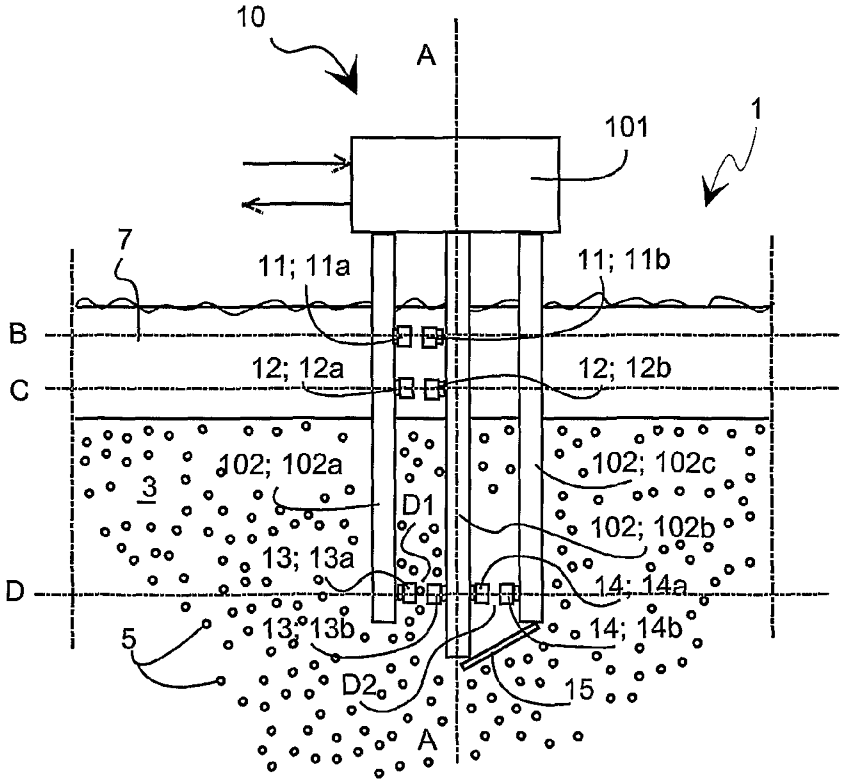
FIG. 2 shows part of the flotation cell and the device according to the invention, which is fitted in connection with the cell.

One device 10 according to the invention for monitoring the operation of the flotation cell is schematically presented in FIG. 2. The device 10 is installed in connection with the flotation cell 1. The device 10 comprises a number of measuring sensors 11, 12, 13, 14 of electrical conductivity, which are fitted in the flotation cell 1 and embedded in the material contained in it; in this case, slurry 3 and a froth bed 7. Instead of the electrical conductivity, its inverse value, i.e., the electric resistance can be measured. The measurements are carried out in real time at suitable intervals. On the basis of the obtained measuring values, the state and/or the properties of the slurry 3 or the froth bed 7 can be defined.

The measuring sensors 11, 12, 13, 14 of the device 10 are arranged on an elongated support 102 at a small distance from one another. The support 102, in turn, is attached to a housing 101. The device 10 can preferably be attached by its housing 101 above the flotation cell 1, for example, to a beam running over the cell and to a desired spot on the surface defined by the sides of the flotation cell.

The support 102 with its measuring sensors is fitted in the flotation cell 1 in an essentially vertical direction A-A and embedded in the material contained by the cell, i.e., slurry 3 and froth 7. In this way, the electrical conductivity of the material in the flotation cell 1 can be measured on several measuring planes B, C, D, as viewed in the vertical direction. In this case, the elongated support 102 is implemented by three straight supporting pipes 102*a*, 102*b*, 102*c*, which are arranged in a parallel relation at a small distance from one another. The measuring heads 11*a*, 11*b* (12*a*, 12*b*; 13*a*, 13*b*; 14*a*; 14*b*) of each measuring sensor 11 (12, 13, 14) are attached to parallel supporting pipes 102*a*, 102*b* (102*a*, 102*b*; 102*a*, 102*b*; 102*b*, 102*c*) so that the measuring heads are on the same plane opposite each another, so that they are separated from one another by a suitable space. The size of this space should be sufficient for the material, i.e., froth and slurry, which are to be measured, to exist and flow in the space.

When several devices 10 are arranged in one flotation cell 1, the electrical conductivity measurements can further be made at several spots on the same measuring plane. In that case, it is obvious that the measuring sensors 11, 12, 13, 14 of the devices 10 are fitted on the elongated support 102 in the same way at even distances from one another.

In the most preferred embodiment of the invention, the measuring sensors 11, 12, 13, 14 of the device 10 are divided into two groups, i.e., a first and a second group. The first group includes the measuring sensors, of which there are preferably two, i.e., the first and the second measuring sensor 11, 12, which are intended for measuring the froth bed 7. In that case, they are arranged on the elongated support 102 at such a height and distance from the housing 101 that they are situated inside the froth bed 7 of the flotation cell 1 and, specifically, on the desired measuring planes B, C. The first measuring plane B is preferably arranged in the upper part of the optimal froth bed 7. The second measuring plane C, in turn, is arranged in the lower part of the froth bed 7 near the upper surface of the slurry 3.

The first measuring sensor 11 that belongs to the first group is intended for measuring the horizontal speed of movement of the froth by monitoring the variations in the froth's electrical conductivity. The horizontal speed of movement is proportional to the froth's speed of movement over the overflow edge and, thus, the exiting speed of the concentrate from the flotation cell.

The second measuring sensor 12 that belongs to the first group is used for monitoring the electrical conductivity by measuring the variations in the properties of the froth bed 7, especially a possible froth collapse or overfrothing. The collapse of froth 7 means that the enrichment process in the flotation cell is interrupted and the minerals that are to be frothed are lost. Overfrothing indicates that a very stable froth is formed, which froth cannot be treated by the conventional centrifugal pumps outside the overflow edge of the flotation cell in the discharge of the concentrate. Before the froth collapse or overfrothing, the bubble structure of the froth starts to change and this is observed as a change in the electrical conductivity by means of the second measuring sensors 12. The electrical conductivity of the froth changes, i.e., quickly increases or decreases immediately before the froth collapse or overfrothing. In that case, the rate of change in the electrical conductivity is monitored and this change can be used to directly predict an unstableness of the froth bed and the said changes.

The sensors that belong to the second group, of which there are also preferably two, i.e., a third and a fourth measuring sensor 13, 14, are intended for measuring the electrical conductivity of the slurry 3. In that case, they are arranged on the elongated support 102 at such a height and distance from the housing 101 that they are situated inside the slurry 3 in the flotation cell 1 and, specifically, on the desired one or two measuring planes. In this application, the third and the fourth measuring sensors 13, 14 are essentially at the same height and, thus, are situated on the same measuring plane D, but they are arranged in adjacent measuring points D1, D2.

The third measuring sensor 13 that belongs to the second group is intended for measuring the electrical conductivity of slurry that contains air, i.e., the electrical conductivity of the mixture of slurry and air bubbles. The fourth measuring sensor 14 that belongs to the second group is intended for measuring the electrical conductivity of slurry that does not contain an essential amount of air, i.e., that does not have any air bubbles. Below the measuring heads 14*a*, 14*b* of the fourth measuring sensor 14, there is arranged a blocking member, such as a plate 15, which has a sufficient surface area and which is used for preventing the entry of the air bubbles 5, which rise from below, in between the measuring heads 14*a*, 14*b* of the measuring sensor 14. The number and/or the size of air bubbles in the slurry between the measuring heads 13*a*, 13*b* of the third measuring sensor 13 influences the electrical conductivity that is measured, and it is proportional to the same. On the other hand, the electrical conductivity of the slurry alone, which is measured by the fourth measuring sensor 14, gives a guideline value, which the measuring result obtained by the third measuring sensor 13 can be compared with. Furthermore, these sensors 13, 14 are essentially on the same plane D and close to each other, whereby the other properties of the slurry (excluding the air content) are essentially similar.

In a preferred embodiment of the invention, the measuring heads of the measuring sensors 11, 12, 13, 14 are made of graphite. The material contained in the flotation cell does not have a significant effect on graphite measuring heads; therefore, their maintenance interval is long and, thus, they have a long service life.

In a preferred embodiment of the invention, the measuring heads of the measuring sensors 11, 12, 13, 14 are electrolytically cleaned. In that case, an adequately high alternating voltage $V_e$ is arranged between the measuring heads for a moment, causing any material that has adhered to the measuring heads to come off. The magnitude of this cleaning voltage $V_e$ is dependent on the properties of the slurry, i.e., the object of the flotation process, among others.

Figure 3:
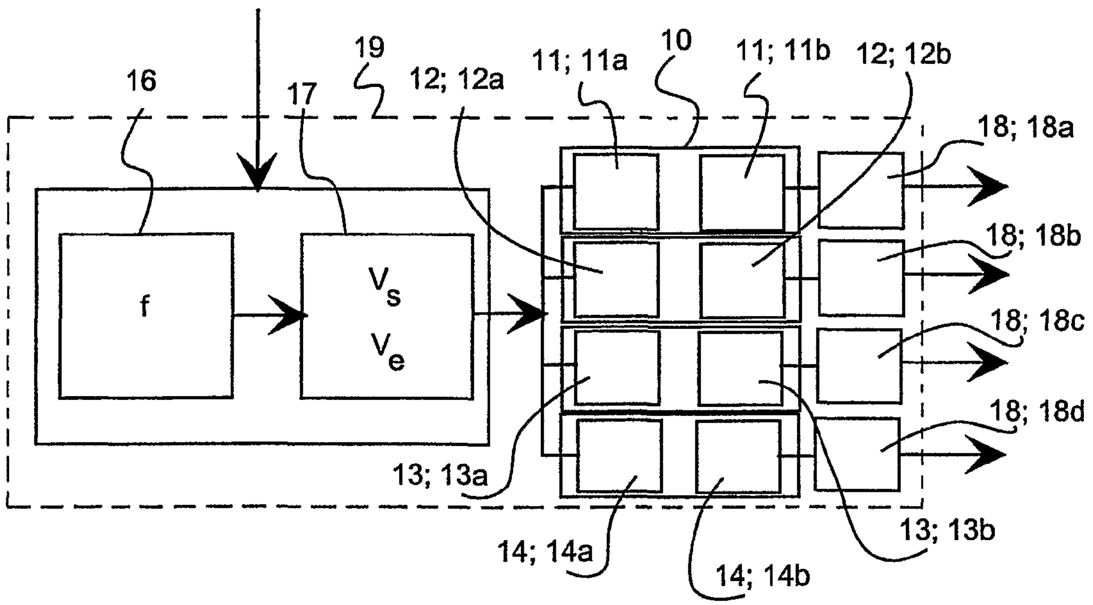
FIG. 3 shows the block diagram of a measuring system.

The electric measuring sensors 11, 12, 13, 14 of the device 10 according to the invention are connected to an indicator device 19 to bring out the measuring signals obtained from the measuring sensors, as illustrated in FIG. 3. In this case, the indicator device 19 comprises an oscillator 16, a voltage source 17 and an amplification stage 18. The device 10, i.e., the measuring sensors, and the indicator device 19 jointly constitute the measuring device for measuring the electrical conductivity (or a corresponding variable) of the material in the flotation cell.

The indicator device 19 comprises at least an AC source, i.e., a measuring voltage source; in this case, the oscillator 16 and the adjustable AC source 17. The frequency of the alternating current of the AC source 17 can be adjusted by adjusting the frequency of the oscillator 16. The amplitude of the alternating voltage across the measuring sensors can also be adjusted. The first pole of the voltage source 17 is connected to the first measuring head 11*a*, 12*a*, 13*a*, 14*a* of each measuring sensor 11, 12, 13, 14, and the second pole is connected to the second measuring head 11*b*, 12*b*, 13*b*, 14*b*. In this way, the properties of the measuring sensors can be adjusted according to the electrical properties of the material that is measured, such as various ore pulps, so that strong enough measuring signals are obtained from the sensors.

The indicator device 19 further comprises at least the amplifying part 18, its each channel having a respective amplifying unit 18*a*, 18*b*, 18*c*, and 18*d*. The second measuring head 11*b*, 12*b*, 13*b*, 14*b* of the measuring sensor 11, 12, 13, 14 is connected to its own channel through the respective amplifying unit 18*a*, 18*b*, 18*c*, 18*d* of the amplifying part 18. The measuring signals obtained from the measuring sensors 11, 12, 13, 14 are amplified in the amplifying unit and moved forward to further processing.

The amplified measuring signal can be converted into a suitable current signal, which is used in moving the measuring data forward from the indicator device 19 to a suitable monitoring and control unit. Alternatively, the measuring signal can be converted into a digital form already in the indicator device 19, after which the measuring data in the digital form is transferred along a suitable digital transmission bus to the said monitoring and control unit.

Figure 4:
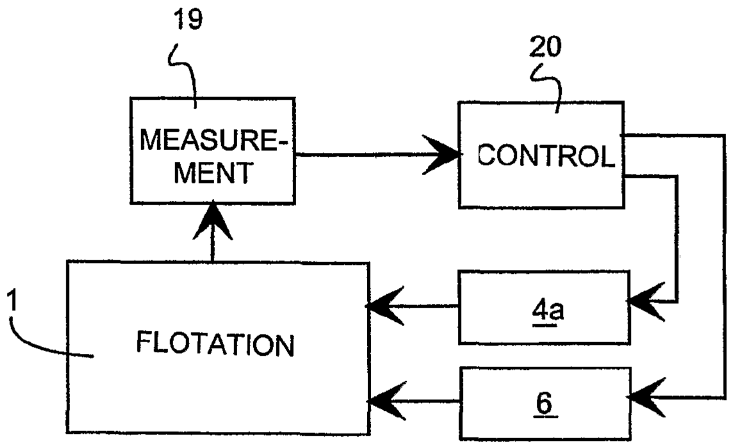
FIG. 4 shows schematically the control arrangement of the flotation cell, which employs the method and the device according to the invention.

One control system of the flotation cell, which the method and the device according to the invention are applied to, is schematically presented in FIG. 4. The material in the flotation cell 1, specifically the froth bed 7 and slurry 3, are measured by the measuring sensors 11, 12, 13, 14 of the device 10, which are situated in the indicator unit 19. The measuring signals are detected and sent to a monitoring and control unit 20, in which they are analyzed. On the basis of the results, the monitoring and control unit 20 gives instructions, for example, so as to reduce or increase the air supply to the air supply devices 4*a* and/or to change the reagent feed to the reagent feeder 6. The control of the flotation cell 1 can be implemented by complying with the principles known as such and presented above in the preamble of the specification.

The invention is not limited to the above application example only, but various alterations are viable within the inventive idea defined by the claims.

REFERENCE NUMBERS

1 flotation cell
1*a* overflow edge of the cell
2 feeding of slurry
3 slurry in the cell
4 air supply and mixing devices
4*a* air supply devices
5 air bubble(s)
51 upward arrows
6 reagent feeding
7 froth bed
8 discharge (recovery) of concentrate
9 waste disposal
10 device for monitoring the operation of the flotation cell
101 housing
102 elongated support
102*a*, 102*b*, 102*c* rods or the like belonging to the support
11 $1^{st}$ measuring sensor—conductivity measurement
11*a*, 11*b* measuring head of the measuring sensor, with two poles
12 $2^{nd}$ measuring sensor—conductivity measurement
12*a*, 12*b* measuring head of the measuring sensor, with two poles
13 $3^{rd}$ measuring sensor—conductivity measurement
13*a*, 13*b* measuring head of the measuring sensor, with two poles
14 $4^{th}$ measuring sensor—conductivity measurement
14*a*, 14*b* measuring head of the measuring sensor, with two poles
15 blocking plate or the like
16 oscillator
17 (alternating) voltage source
$V_s$ alternating voltage/measuring voltage
$V_e$ alternating voltage/cleaning voltage
18; 18*a*, 18*b*, 18*c* amplifying stage of the measuring signal, and its parts
19 indicator unit
20 control unit
A-A vertical direction
B $1^{st}$ measuring plane
C $2^{nd}$ measuring plane
D $3^{rd}$ measuring plane
D1 $1^{st}$ measuring point on plane D
D2 $2^{nd}$ measuring point on plane D

The invention claimed is:

1. A method of monitoring the operation of a flotation cell containing slurry and a froth bed characterized in that the electrical conductivity of the froth bed (7) in the flotation cell is measured in the vertical direction on a first measuring plane (B), the conductivity measurements being used for monitoring the froth speed towards an overflow edge of the flotation cell.

2. A method according to claim 1, characterized in that the electrical conductivity of the froth bed (7) in the flotation cell is measured in the vertical direction on a second measuring plane (C), the conductivity measurements being used for monitoring variations in the properties of the froth bed, which predict a froth collapse or overfrothing.

3. A method according to claim 1, characterized in that the electrical conductivity of the slurry (3) in the flotation cell (1) is measured in the vertical direction on at least one measuring plane (D), the conductivity measurements of the slurry being used for monitoring the changes in the air content contained in the slurry or the size of the air bubbles.

4. A method according to claim 3, characterized in that a first conductivity value of the slurry is defined for the slurry with the air bubbles contained in it, and a second conductivity value of the slurry is defined for the slurry without the air bubbles.

5. A method according to claim 1, characterized in that the measuring sensors (11, 12, 13, 14) have measuring heads that are electrolytically cleaned by means of an adequately high alternating voltage ($V_e$).

6. A method according to claim 3, characterized in that the electrical conductivity of the material in the flotation cell is measured in the vertical direction at different depths on several measuring planes (B, C, D).

7. A device for monitoring the operation of a flotation cell, comprising: a number of measuring sensors (11, 12, 13, 14) of the electrical conductivity, which are to be fitted in the flotation cell (1) and immersed in the material (3, 7) contained in it, to measure its electrical conductivity wherein the measuring sensors are arranged on an elongated support (102) at a small distance from one another, and the support with its measuring sensors can be fitted, in an essentially vertical direction, in the flotation cell (1) and the material (3, 7) contained in it to measure the electrical conductivity of the material in the flotation cell in the vertical direction on several measuring planes (B, C, D) and wherein the measuring sensors (11, 12, 13, 14) of the device (10) are divided into a first and second group, of which the measuring sensors (11, 12) which belong to the first group measure the froth bed (7), and the measuring sensors (13, 14) which belong to the second group measure the slurry (7), and a control unit (20) which uses the measurements of the measuring sensors of the first group to determine the speed of movement of the froth bed (7) and for predicting a collapse of the froth bed (7) or overfrothing.

8. A device according to claim 1, characterized in that the measuring sensors (13, 14) measure both the electrical conductivity of the mixture of slurry and air bubbles and, the electrical conductivity of the slurry alone.

9. A device according to claim 1, wherein the measuring sensors (11, 12, 13, 14) of the device (10) are connected to an oscillator (16) and a voltage source (17) of an indicator unit (19), the amplitude and the frequency of the alternating voltage across the measuring sensors being suitably selectable by means of said oscillator and voltage source.

10. A device according to claim 1, wherein the measuring heads of the measuring sensors (11, 12, 13, 14) of the device are made of graphite.

* * * * *